(12) United States Patent　　　(10) Patent No.:　US 12,696,676 B2

Rinzler et al.　　　　　　　　　　　(45) Date of Patent:　Jul. 28, 2026

(54) ELECTRICAL PLANARIZATION OF CARBON NANOTUBE THIN FILMS FOR ELECTRONIC DEVICE APPLICATIONS

(71) Applicant: University of Florida Research Foundation, Inc., Gainesville, FL (US)

(72) Inventors: Andrew Gabriel Rinzler, Gainesville, FL (US); Rajib Kumar Das, Gainesville, FL (US); Bo Liu, Gainesville, FL (US); Max G. Lemaitre, Gainesville, FL (US)

(73) Assignees: UNIVERSITY OF FLORIDA RESEARCH FOUNDATION, INC., Gainesville, FL (US); MATTRIX TECHNOLOGIES, INC., Gainesville, FL (US)

( * ) Notice: Subject to any disclaimer, the term of this patent is extended or adjusted under 35 U.S.C. 154(b) by 375 days.

(21) Appl. No.: 18/199,513

(22) Filed: May 19, 2023

(65) Prior Publication Data

US 2023/0397478 A1　Dec. 7, 2023

Related U.S. Application Data

(60) Provisional application No. 63/344,364, filed on May 20, 2022.

(51) Int. Cl.
　　*H10K 71/18*　　(2023.01)
　　*B82Y 40/00*　　(2011.01)
　　*H10K 71/60*　　(2023.01)

(52) U.S. Cl.
　　CPC ............. *H10K 71/18* (2023.02); *B82Y 40/00* (2013.01); *H10K 71/60* (2023.02)

(58) Field of Classification Search
　　CPC ...... H10K 71/18; H10K 71/60; H10K 10/491; H10K 71/12; H10K 85/221; B82Y 40/00; B82Y 10/00
　　See application file for complete search history.

(56) References Cited

U.S. PATENT DOCUMENTS

2020/0006654 A1 *　1/2020　Chi ......................... C23C 16/26

* cited by examiner

*Primary Examiner* — Thanh Y. Tran

(74) *Attorney, Agent, or Firm* — Thomas | Horstemeyer, LLP

(57)　　　　ABSTRACT

Various examples are provided related to electrical planarization of carbon nanotube thin films or networks. In one example, a method includes depositing one or more thin protective organic and/or inorganic layer across a nanotube film; disrupting electrical conductance of portions of the nanotube film by exposure of out-of-plane nanotubes to a planarization process that disrupts the electrical conductance through the one or more thin protective organic and/or inorganic layer; and removing the one or more thin protective organic and/or inorganic layer from the nanotube film.

23 Claims, 10 Drawing Sheets

ELECTRICAL PLANARIZATION OF CARBON NANOTUBE THIN FILMS FOR ELECTRONIC DEVICE APPLICATIONS

CROSS REFERENCE TO RELATED APPLICATIONS

This application claims priority to, and the benefit of, U.S. provisional application entitled "Electrical Planarization of Carbon Nanotube Thin Films for Electronic Device Applications" having Ser. No. 63/344,364, filed May 20, 2022, which is hereby incorporated by reference in its entirety.

BACKGROUND

Several electronic applications of single wall carbon nanotube (SWCNT) thin films require electrical conductivity throughout the plane of the film but require electrical isolation of the film from other electrically conducting layers above the plane of the film achieved through thin (often sub-micron) dielectric or semiconductor layers, depending on the application. This can be challenging to achieve because if a protrusion exists on the substrate on which the SWCNT film is deposited, or if a particle is co-deposited along with the SWCNT film, the electrically conductive nanotubes that go over the protrusion or particle can approach close enough to the electrically conducting layer (from which they are meant to be isolated) to create an electrical short circuit between the two layers. Such short circuits are deleterious to the device function.

For example, single wall carbon nanotubes (SWCNTs) may be used as the semiconducting channel in lateral channel field effect transistors (FETs) in which a film of semiconducting SWCNTs bridges the gap between a source and drain electrode that lies in the same lateral plane as the film. In a top gate configuration, a metal gate electrode resides over the SWCNT film separated from it only by a thin (sub-micron) dielectric layer. Electrical isolation between the gate electrode and SWCNT film channel is critical for the FET to function.

In cases where the gate electrode resides below the SWCNT film (bottom gate configuration) protrusions or particles below the SWCNT film can still be problematic. In so called very large-scale integration (VLSI), devices are fabricated in layers isolated from each other by dielectrics except for vias that permit electrical communication between layers. Electrical shorts between out-of-plane SWCNTs and other conductive layers due to failure of isolation layers caused by CNT protrusions or particles must be avoided here as well to preserve function.

SWCNT films are also used in vertical FETs (VFETs) and in vertical organic light emitting transistors (VOLETs). In these devices, the SWCNT film comprises the source electrode on top of which a thin semiconducting layer is place. In this case, a gate electrode below the SWCNT source electrode controls a barrier to transport across the junction between the SWCNT source electrode and the semiconducting layer. If due to a protrusion or particle the SWCNTs extend across the semiconducting layer, control can be lost and the transistor can have a source drain short for the VFET or have a light emitting spot or region that is struck on for the LET.

SUMMARY

Aspects of the present disclosure are related to electrical planarization of carbon nanotube thin films or networks. In one aspect, among others, a method for electrical planarization of nanotube films or networks comprises depositing one or more thin protective organic and/or inorganic layer across a nanotube film; disrupting electrical conductance of portions of the nanotube film by exposure of out-of-plane nanotubes to a planarization process that disrupts the electrical conductance through the one or more thin protective organic and/or inorganic layer; and removing the one or more thin protective organic and/or inorganic layer from the nanotube film. In various aspects, the nanotube film can be disposed on a substrate surface and the electrical conductance of out-of-plane nanotubes that protrude more than 10 times an average nanotube film thickness above the substrate surface is disrupted. The nanotube film can comprise single wall carbon nanotubes.

In one or more aspects, the nanotube film can be disposed on a substrate in electrical contact with one or more contact pad or contact electrode. The substrate can be a glass substrate. At least one of the one or more contact pad or contact electrode can be connected to a current supply line. At least a portion of the out-of-plane nanotubes can be formed over a particle. The thin organic or inorganic layer can be deposited over the nanotube film. The thin organic or inorganic layer can comprise PMMA. The thin organic or inorganic layer can have a thickness in a range from about 50 nm to about 300 nm. The thin organic or inorganic layer can have a thickness in a range from about 70 nm to about 200 nm.

In various aspects, the planarization process can comprise exposure of the out-of-plane nanotubes to oxidation through the one or more thin protective organic and/or inorganic layer. The out-of-plane nanotubes can be exposed to an electrolyte for electrochemical oxidation. The electrolyte can comprise a KOH electrolyte. The out-of-plane nanotubes can be exposed to an oxygen plasma asher for oxidation, or to UV/ozone for oxidation, or to chemicals that disrupt the nanotube conductance by esterification/amidation, halogenation, cycloaddition, radical, nucleophilic or electrophilic addition.

In one or more aspects, the method can comprise forming a layer of semiconducting channel material on top of the CNT film; and forming one or more electrodes on top of the layer of semiconducting channel material. The layer of semiconducting channel material can comprise an organic semiconductor. The one or more electrodes can comprise a drain electrode. OLED layers can be deposited on top of the semiconducting channel material followed by deposition of an electron injecting drain electrode. The method can comprise forming a layer of dielectric material on top of the CNT film; and forming one or more electrodes on top of the layer of dielectric material to provide a top gate electrode. The method can comprise forming a layer of dielectric material on top of the CNT film to isolate the CNT film from subsequently deposited layers.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1A:
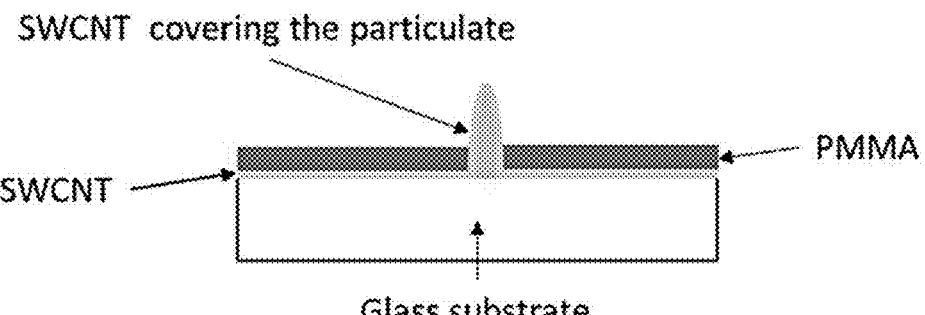
FIGS. 1A-1C illustrate an example of an electrochemical planarization method, in accordance with various embodiments of the present disclosure.

Disclosed herein are examples related to the electrical planarization of carbon nanotube thin films for electronic device applications such as, e.g., display applications. In contrast to mechanical planarization where a surface is leveled, electrical planarization is here defined as a disruption of the out-of-plane conductance of a SWCNT film or network around protrusions while minimally disrupting the in-plane film or network conductance. Methods are presented for disrupting the electrical conductance locally around such protrusions (or particles) of the SWCNT film to electrically isolate the spot or region with fine control over the extent of damage to SWCNT films outside the spot or region. Reference will now be made in detail to the description of the embodiments as illustrated in the drawings, wherein like reference numbers indicate like parts throughout the several views.

OLED displays have superior power consumption, pixel brightness, contrast ratio, response time and viewing angle compared to liquid crystal displays (LCDs). However, large scale implementation of OLED displays for TVs has remained challenging due to a lack of suitably uniform, robust drive transistors in the active matrix backplane. The carbon nanotube enabled vertical field effects transistor (CN-VFET) allows for short channel lengths without high resolution lithography, permitting the use of low mobility channel materials, to demonstrate on-currents at low operating voltages suitable for driving organic light emitting diodes (OLED) pixels for display applications. Moreover, by stacking the OLED layers directly between the CN-VFET's semiconducting channel layer and the drain electrode, the device becomes an integrated vertical organic light emitting transistor (CN-VOLET). However, the vertical CN-VFET architecture is not without its challenges. Among these is the short distance, of order a few hundred nanometers to 1 micron, between the carbon nanotube network source electrode and the drain electrode. Contaminant particles or protrusions situated beneath the SWCNT network, where the nanotubes conformally go over them, can approach sufficiently close to the drain electrode to create an electrical short. In the CN-VOLET if the out of plane nanotubes get too close to the drain electrode the resulting electrical short would ultimately prevent a pixel containing it from lighting up, and potentially damaging neighboring pixels due to Joule heating from the high shorting current. Alternatively, if the out of plane nanotubes only cross the semiconducting channel layer, the pixel would be partially on, with a lack of gate control over its light emission. The magnitude of this challenge becomes clear when one considers that a 1080P HD display has of order 3-4 million subpixels with reputable panel manufacturers permitting less than 6 dead pixels per panel.

Similarly, the particles and aggregation of carbon nanotubes can also be a major hurdle for lateral channel semiconducting SWCNT field effect transistor based electronic devices including microprocessor, sensors, and other applications. It would create electrical shorts to the top metal layers for signal routing and power distribution to the device. Creating thick insulating layers to avoid such electrical shorts would be prohibitive for commercial VLSI manufacturing. Protruding CNTs over particles or aggregated CNTs can also create gating issue for top gated lateral channel devices.

Planarization techniques widely used in industry include chemical mechanical polishing (CMP), reflow of materials (metal or oxide), and spin-on-glass (SOG). While some of these may be suitable for dealing with substrate protrusions, they do not contend with particle contaminants within the SWCNT layer. CMP may be applicable after the SWCNT network deposition but the SWCNTs typically have more adhesion to each other than to the gate dielectric surface on which they reside running the risk of delaminating large areas of the network and corrosive attacks from slurry chemicals used during the process are likely to cause other problems for the devices. A method of microplasma-based planar process for vertically grown CNT forests has been shown where electric field concentration preferentially etched away high CNTs, but it is unlikely that the aspect ratio needed for the necessary field concentration can work when the SWCNTs lie in-plane.

As shown here use of oxidative defects can be an effective method for planarization of carbon nanotube films for electronic device applications. The nanotube layer can be coated by a thin organic or inorganic layer (e.g., PMMA) that protects the in-plane nanotubes while the protruding SWCNTs are less protected and left susceptible to treatments that create sufficient defects in them to locally degrade their electrical conductivity to the point where they no longer provide electrical shorting pathways. The defects can be introduced to the protruding carbon nanotube via oxidation or other methods including, but not limited to, plasma, UV/Ozone treatments, peroxide treatments or electrochemical methods.

When a thin PMMA layer is formed from solution by a conventional deposition method such as spin-coating or slot die coating, it provides a uniform coverage with a consistent thickness over non-protruding portions of a SWCNT thin film or network, while forming a thinned region or region with incomplete coverage over protrusions, high spots or particles. Therefore, the thin PMMA layer can protect the non-protruding SWCNTs, while the thinned region or region with incomplete coverage in the PMMA layer at high spots provides sufficient access to an electrolyte to electrochemically disrupt the local electrical conductivity by the introduction of defects via electrochemical oxidation. High performance VFET devices have been fabricated using this planarization technique.

Figure 1B:
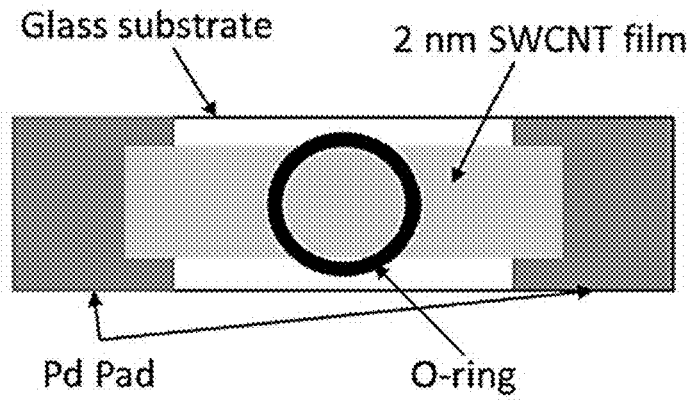
Figure 1C:
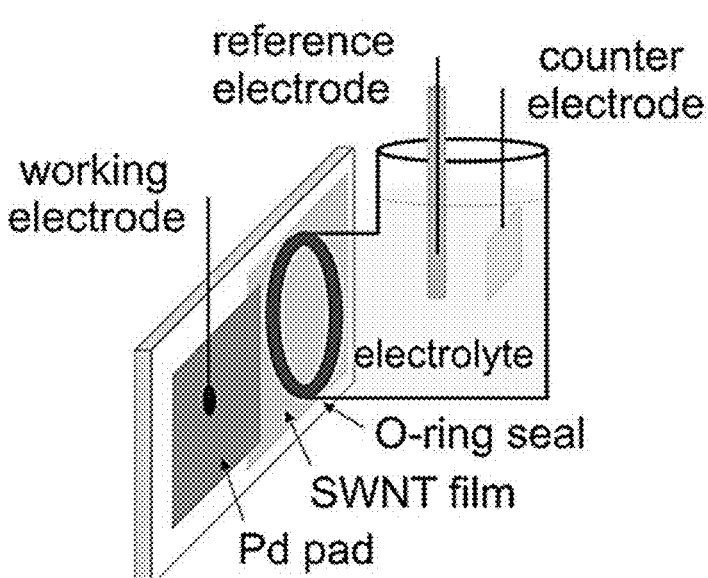

Referring to FIGS. 1A-1C, an example of the electrochemical planarization method is illustrated. FIG. 1A is a side view illustrating an example of a glass substrate with a particle on its surface. When the substrate is coated with a SWCNT film, the particle is also covered, which elevates the SWCNT film around the particle. Protrusions of the SWCNT film can also be formed at one or more locations during the coating process. To address the high points in the SWCNT film, a thin layer of PMMA can be spin coated over the SWCNT film to protect flat areas, while leaving the elevated areas as shown in FIG. 1A more exposed. It should be understood that FIG. 1A idealizes the PMMA layer around the protrusion as not coating the top of the protrusion at all. This is not realistic. The spin coated PMMA layer would in fact somewhat coat across the protrusion but in general be thinner there. It might be imagined that such coating is continuous but, at the nanoscale, the polymer chains cross each other with void spaces in the vicinity of their crossing points as well as at void defects due to various surface tension and London forces as the solvent evaporates. It is due to those voids that the electrolyte can locally penetrate the layer to access the nanotubes. Under the application of an electric potential, electrowetting may further enhance that local penetration. It is only once the polymer layer is thick enough that the path through those voids becomes sufficiently long and tortuous that the electrolyte is excluded, thereby protecting the in-plane nanotubes that lie flat on the substrate. What constitutes thin and thick enough depends upon the specific protective layer used as well as its deposition method and can be determined experimentally with a statistically significant number of pixels.

FIG. 1B is a top view of the substrate showing an example of the layout of the SWCNT film with the thin layer of PMMA not shown for illustration. Two palladium (Pd) pads are deposited on the glass substrate to make electrical contact with the SWCNT film. An O-ring is shown to define the area that has access to the electrolyte. FIG. 10 illustrates an example of the electrochemical setup (with the thin layer of PMMA not shown). The substrate is pressed against a cell with electrolyte, thereby exposing the PMMA and any protruding SWCNT film to the electrolyte in the cell. The SWCNT film acts as the working electrode with platinum (Pt) used as the counter electrode and Ag/AgCl used as the reference electrode in the cell. As previously discussed, the protruding SWCNTs are less protected and left susceptible to degradation by the electrochemical oxidation process.

As a first experiment, to test the effect of electrochemical oxidation on the (unprotected) SWCNTs, a SWCNT network strip (15 mm wide by 35 mm long) possessing a network density typically used in CN-VFETs was prepared using a vacuum filtration method and transferred to a glass substrate with two Pd contacts connected to opposite ends of the strip. Prior to the electrochemical treatment, the two terminal electrical resistance across the SWCNT network strip was measured to be 51.8 k$\Omega$. The 15 mm strip width was limited by the need for its width fit entirely within the inner diameter of the O-ring seal used for the side mount electrochemical cell, as shown in FIG. 1C.

Cyclic voltammetry (CV) was carried out in 1 mM KOH electrolyte with the exposed portion of the SWCNT film as the working electrode (WE) (and with a Pt counter electrode and Ag/AgCl reference electrode). After 1 CV cycle (5 mV/s) attaining 8.9 $\mu$A/cm$^2$ at 1.0V the resistance across the SWCNT film (2 terminal Pd pad-to-pad) rose to 62 k$\Omega$. Following this CV cycle, chronopotentiometry (CP) at a 40 $\mu$A/cm$^2$ oxidation current was run for 15 seconds. The post treatment resistance was found to be greater than the 10 M$\Omega$ limit of the multi-meter used to measure it. This demonstrated that the electrochemical oxidation was effective for disrupting the SWCNT conductivity.

Figure 2A:
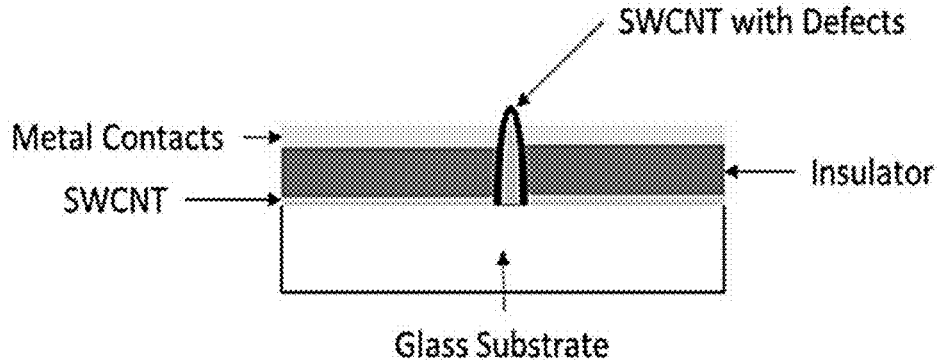
FIGS. 2A and 2B illustrate an example of a layer of insulator and top metal contacts deposited on the SWCNT film, in accordance with various embodiments of the present disclosure.
Figure 2B:
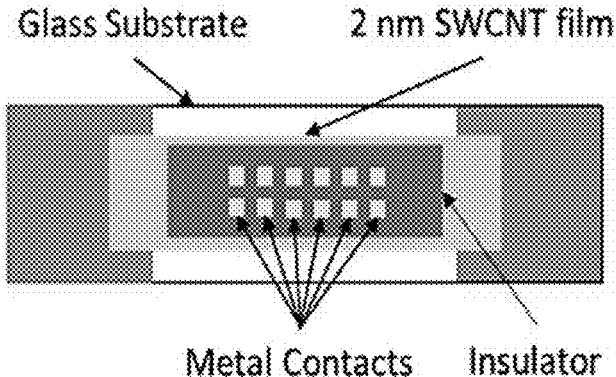

FIGS. 2A and 2B illustrate another experiment where, for a similar SWCNT film strip between the two Pd pads (initial resistance 69 k$\Omega$), a 70 nm thick layer of PMMA was spin coated onto the network. After performing CV under the same conditions as above, the maximum WE current was 0.9 $\Omega$A/cm$^2$ at 1.0V, after which the cross-film resistance was found to be 67 k$\Omega$, lower even than the initial resistance. This may be attributed to the surface tension induced by the PMMA as its solvent evaporated bringing the SWCNTs into more intimate contact across the film. Subsequently chronopotentiometry (CP) at a 10 $\mu$A oxidation current was run for 60 seconds which raised the cross-film resistance to 98 k$\Omega$. Following this treatment, and after rinsing and drying the sample, gold was evaporated on top of the PMMA through a shadow mask defining an array of 400 $\mu$m diameter circular electrodes. FIG. 2A is a side view and FIG. 2B is a top view showing a layer of insulator and top metal contacts deposited on the SWCNT film. Of these electrodes 30 were over the electrochemically (EC) treated area and 40 were outside that region. After the electrochemical planarization, the SWCNTs around particles in the EC treated area should be non-conductive.

Two terminal conductance tests were performed in a probe station using a thin flexible gold wire as the probe. The gold wire softly contacted the Au disk electrodes to avoid damaging the structure. Of the 40 electrodes outside the EC treated area, all 40 immediately passed increasing current starting below 100 mV indicating that they were all electrically shorted with only a 70 nm layer of PMMA over them. Of the 30 electrodes in the EC area, only one of these was electrically shorted, however, this electrode was suspect due to it being immediately adjacent to the cell O-ring edge. The others all tolerated over ±10V across the 70 nm PMMA film, exhibiting negligible current until breakdown occurred at about 13V. This corresponds to about 186 MV/m. A cursory search of PMMA dielectric breakdown strength finds values much lower than this (15-25 MV/m), however this is thought to be due to impurities in the materials used and when high quality PMMA is spin coated as thin films, values as high as 580 MV/m have been reported.

Figure 3:
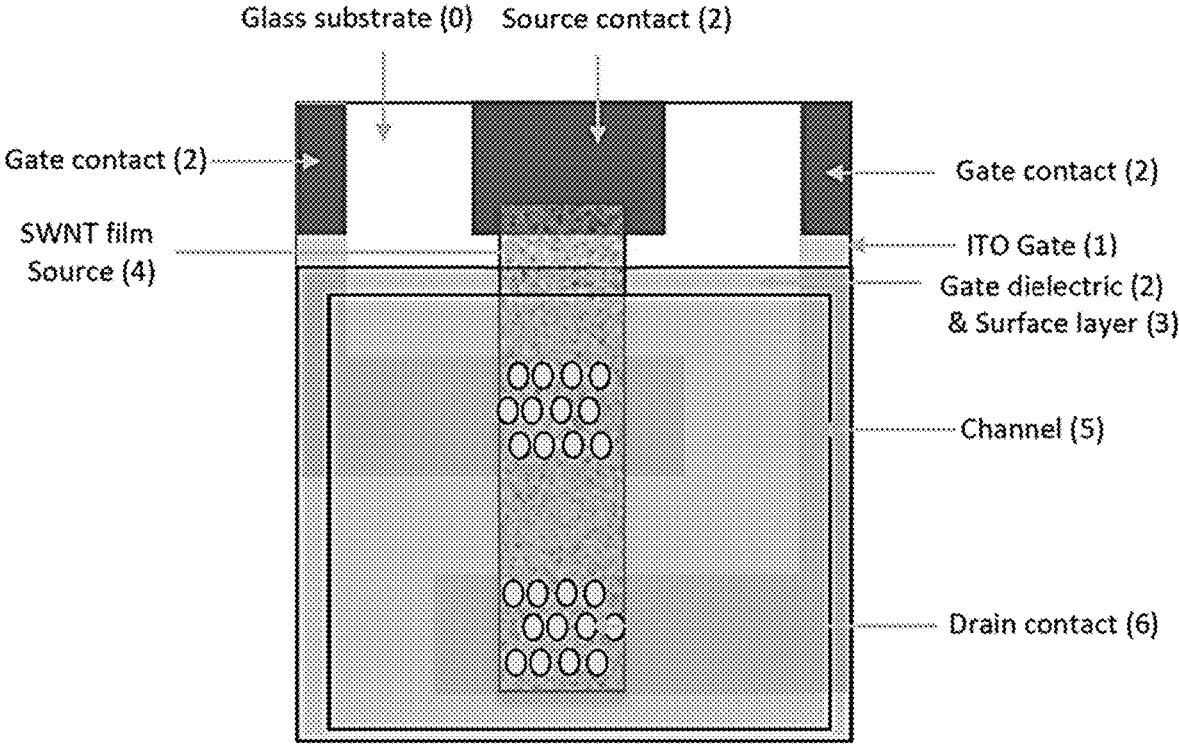
FIG. 3 is a schematic diagram illustrating an example of an 80-pixel device fabricated on an indium tin oxide (ITO)/ glass substrate, in accordance with various embodiments of the present disclosure.

To demonstrate the effectiveness of the electrochemical (EChem) planarization of SWNT film electrodes for electronic applications, 80-pixel VFET devices were built on two substrates using different thickness of protecting PMMA (70 nm and 200 nm). FIG. 3 is a schematic diagram illustrating the 80-pixel device fabricated on an indium tin oxide (ITO)/glass substrate. The numbers in parentheses correspond to the layer order with the glass substrate (0) being the lowest, followed by the ITO gate (1), source and gate contacts and gate dielectric (2), surface layer (3), SWCNT film source (4), channel (5) and drain contact (6).

Initially, ITO coated glass wafers were cleaned via sonication in soap water, DI water, acetone, and isopropanol. Source and gate metal contact pads were deposited and patterned by sputtering 100 nm molybdenum (Mo) and subsequent lift off. Gate dielectric aluminum oxide ($AlO_x$) was deposited and patterned using atomic layer deposition on photolithographically patterned ITO. Organic surface layer (SL) dielectric was deposited by spin coating the polymer solution onto each substrate. The surface layer was patterned by photolithography; these provided a gate dielectric exhibiting a low leakage current, high field breakdown strength, and low surface roughness for subsequent carbon nanotube source deposition.

Figure 4A:
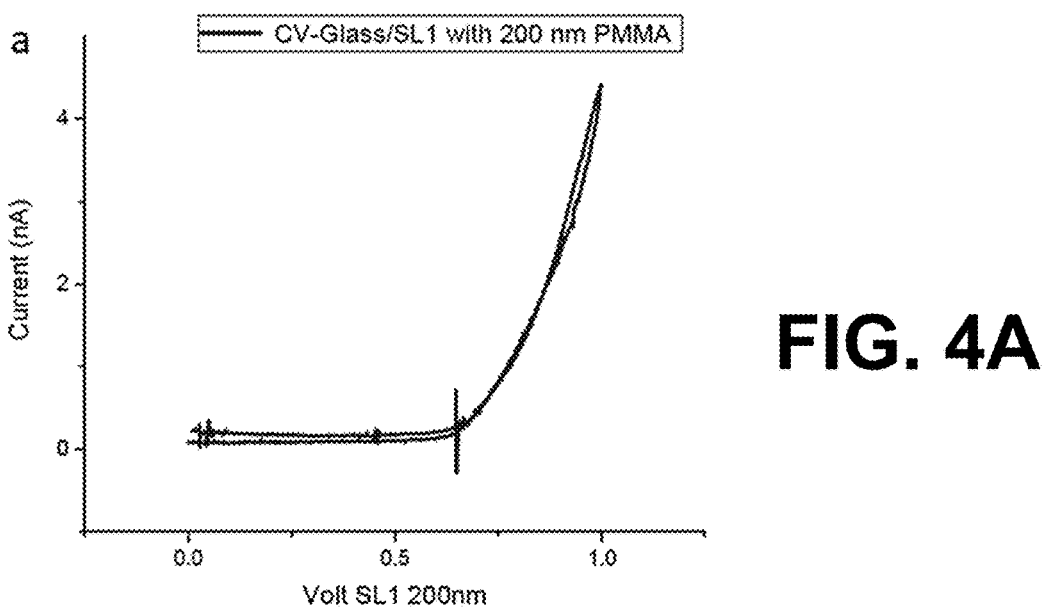
FIGS. 4A and 4B illustrate cyclic voltammetry (CV) and chronopotentiometry of the SWCNT film with a 200 nm PMMA overcoating layer, in accordance with various embodiments of the present disclosure.
Figure 4B:
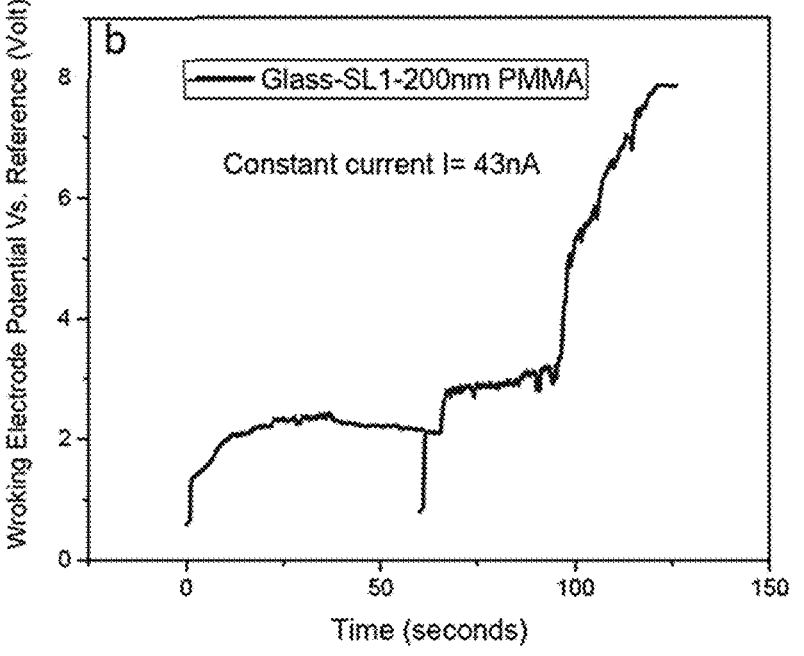

A thin film of SWCNTs was sprayed onto each of the two substrates and patterned using oxygen plasma protecting the active area with polymer thin films. These SWCNT films were planarized by the electrochemical oxidation method on these substrates as follows. A thin film of PMMA was spin coated at a thickness of 70 nm onto the SWCNT network on one substrate and 200 nm onto the SWCNT network of the other substrate. Cyclic voltammetry was carried out in 1 mM KOH with the PMMA coated SWCNT film as the working electrode. For the 200 nm PMMA anodic oxidation current of 4.3 nA was observed at 1V (vs. Ag/AgCl) during the CV scan. FIG. 4A illustrates the CV of the SWCNT film with a 200 nm PMMA in 1 mM KOH electrolyte. The SWCNT film was oxidized for 120 seconds by application of 43 nA anodic current while monitoring the working electrode potential. The working electrode's voltage limit was set to 8V which was reached toward the end of the CP run. The working electrode potential versus time is shown FIG. 4B (chronopotentiometry of SWCNT film with 200 nm PMMA at anodic current of 43 nA).

Following this electrochemical oxidation, the PMMA layer was removed by its dissolution in organic solvents in which PMMA is highly soluble. A thin layer of the organic semiconductor channel material 2,2',7,7'-tetrakis-(diphenylamino)-9,9'-spirobifluorene (spiro-TAD) was deposited onto the SWCNT source network by thermal evaporation through a shadow mask to coat the active area. Finally, Au drain electrodes were evaporated using a stainless-steel mesh as a shadow mask to define 80 devices, each having the area of the Au drain electrode, which was $0.13 \ mm^2$.

Figure 5A:
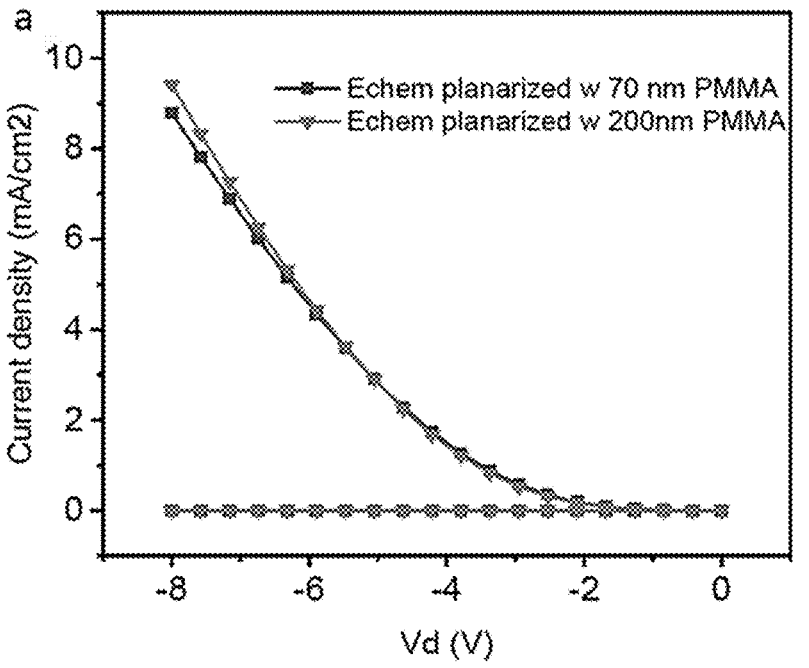
FIGS. 5A-5D illustrate performance of the electrochemically planarized 80-pixel device with 70 nm and 200 nm overcoating PMMA of FIG. 3, in accordance with various embodiments of the present disclosure.
Figure 5B:
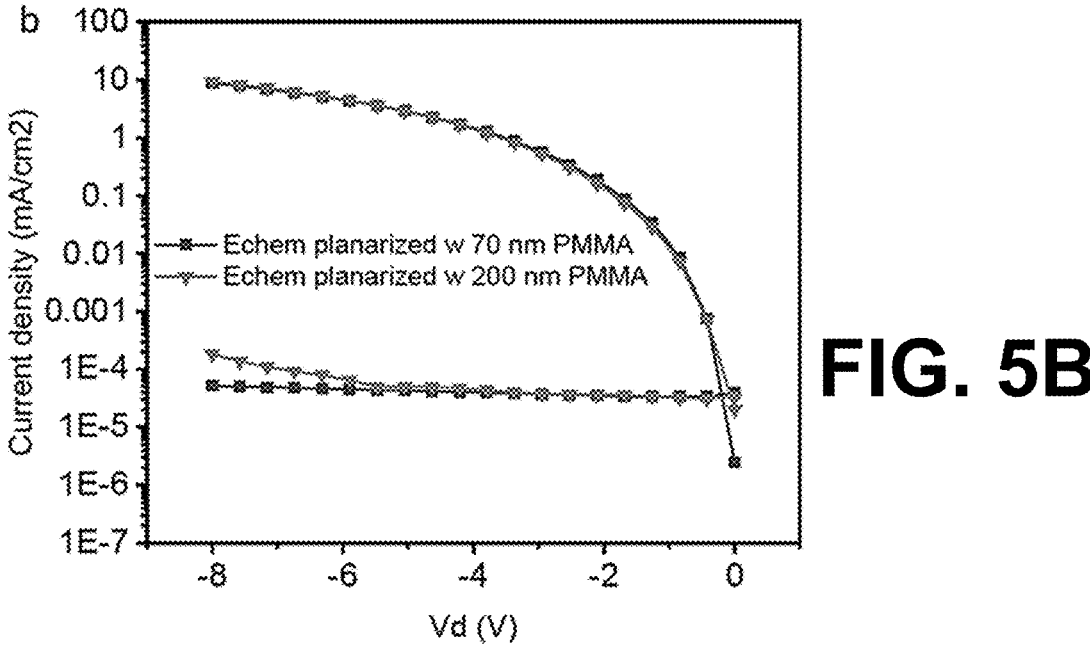
Figure 5C:
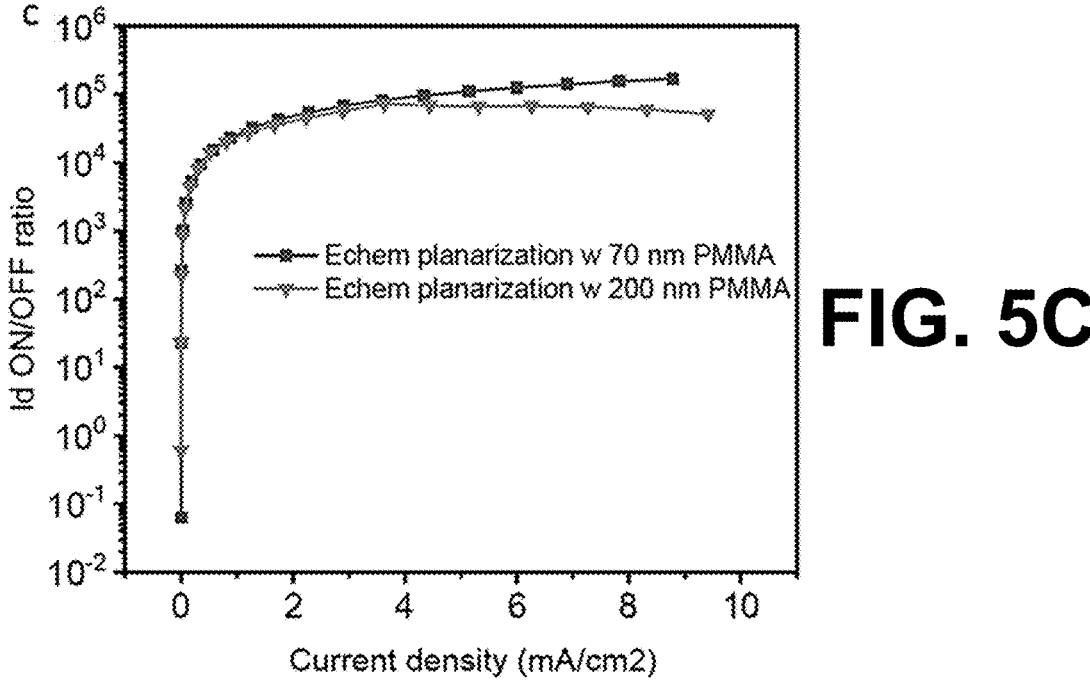
Figure 5D:
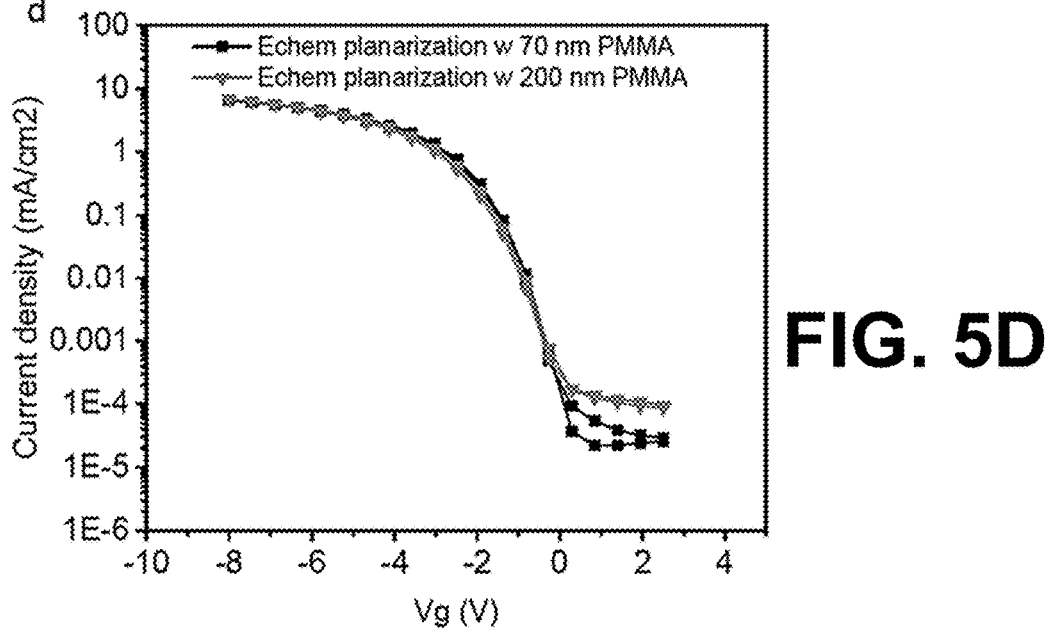

The performance of these devices was characterized in a probe station using a flexible gold wire probe to contact the drain electrodes without damaging the devices. None of these 80 EChem planarized devices was shorted demonstrating a 100% device yield compared to a 37% device yield for another comparable set of devices that were not planarized used as control devices. A similar EChem planarization was performed on the substrate coated with 70 nm PMMA followed by the fabrication of 73 CN-VFET devices built on that substrate. Many of these devices exhibited a high gate leakage indicating a problem ultimately traced to the processing of the gate dielectric layer (unrelated to the planarization). However, because some of these devices behaved normally, a comparison between the two sets of device PMMA layers (one planarized with the 70 nm and the other with the 200 nm) could be made. The typical output characteristics of the CN-VFET devices with the two different PMMA thickness (70 nm and 200 nm) are shown in the output curves of FIGS. 5A (linear scale) and 5B (log scale). Both devices exhibit a high on to off current ratio vs. output current density as shown in FIG. 5C. FIG. 5D shows the transfer curves for the devices.

Figure 6:
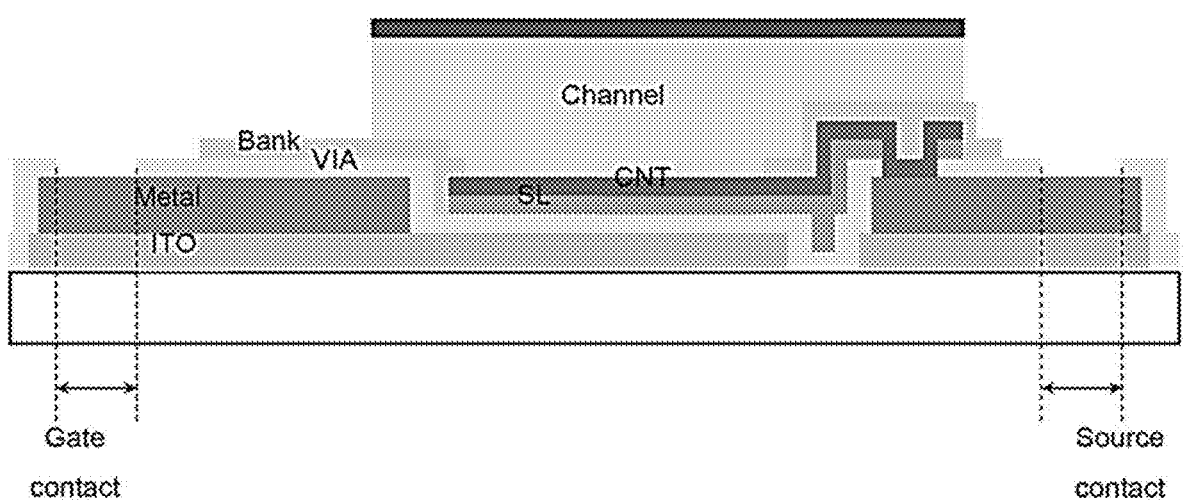
FIG. 6 is a schematic diagram illustrating a 15-pixel device with bank, in accordance with various embodiments of the present disclosure.

These CN-VFET devices made with a SWCNT film in which one edge of the film made contact to the source contact pad (as shown in FIG. 3) showed reasonable performance and good yield. However, the current density in the devices was limited by the impedance of the dilute SWCNT film and the large separation distance between each CN-VFET device relative to the source contact pad. The greater that distance between them (electrically bridged only by the impedance of the dilute SWCNT network), the lower the device on-state current density. A more refined device build in which distances are micro-lithographically defined is a 15-pixel device where the source contact to the pixel area is less than 60 microns. An example of the device architecture (not to scale) is shown in FIG. 6. Such devices were fabricated, with the SWCNT active area EChem planarized as described above using both a 70 nm and a 200 nm PMMA protective layer on two separate substrates. With the SWCNT films as the working electrodes, a constant anodic current of 7 nA for 60 seconds and 4 nA for 140 seconds were applied for the 70 nm and 200 nm PMMA covered substrates, respectively. Upon completion of the electrochemical planarization, photoresist (used to protect the metal electrodes) was dissolved in developer and the PMMA was removed by solvent baths. The organic channel materials spiro-TAD and Au drain were deposited by thermal evaporation through a shadow mask.

Figure 7A:
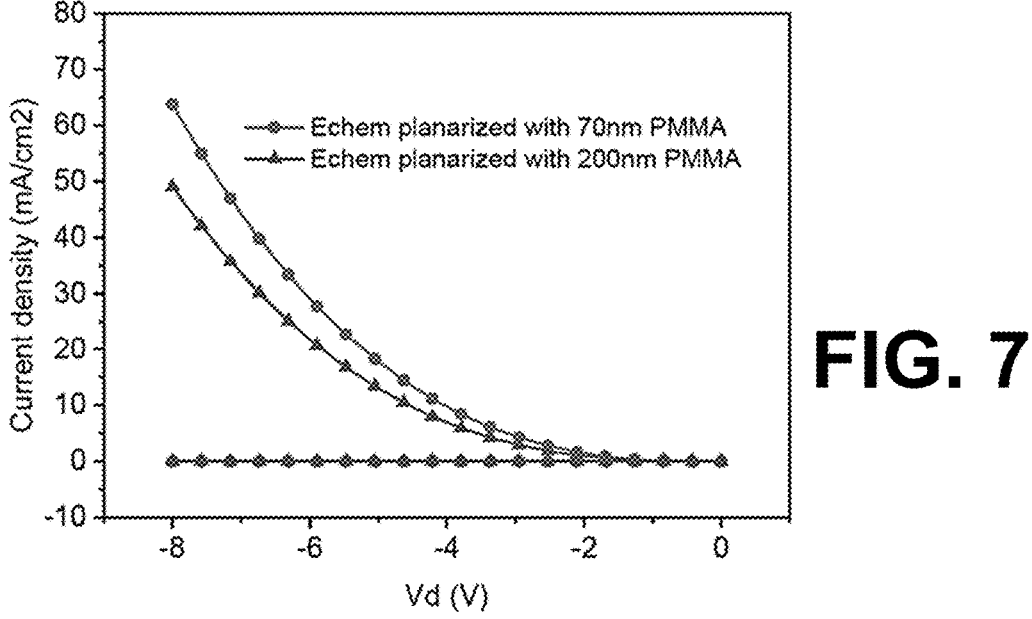
FIGS. 7A-7E illustrate performance of an electrochemically planarized 15-pixel device with 70 nm and 200 nm overcoating PMMA, in accordance with various embodiments of the present disclosure.
Figure 7B:
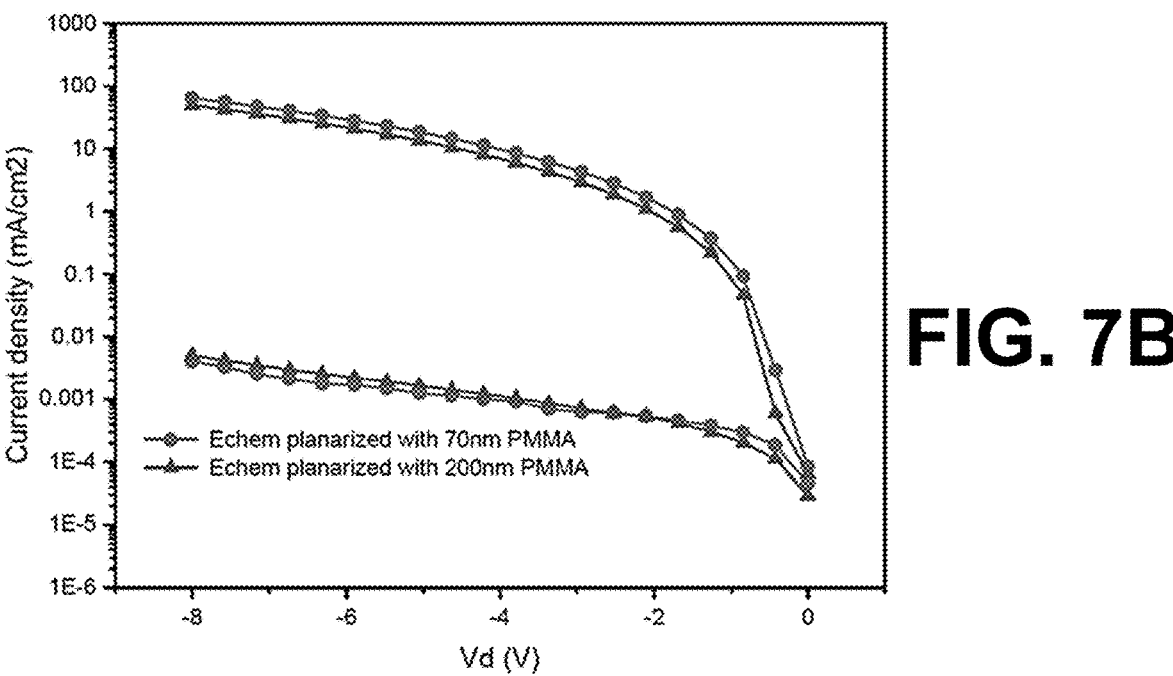
Figure 7C:
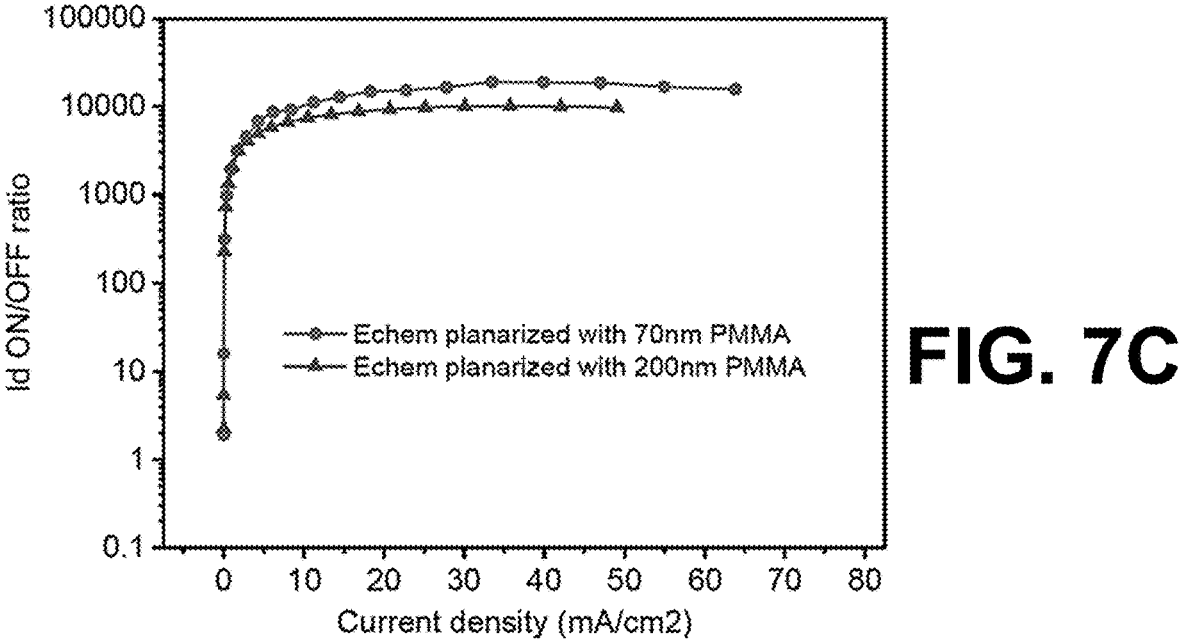

Both sets of devices showed a high output current density as shown in FIGS. 7A and 7B and a high current on-off ratio as shown in FIG. 7C. There were no shorted pixels for either of these EChem planarized devices. Such devices fabricated without some form of planarization or other methods to control particulates invariably exhibited a major fraction of source drain shorted pixels.

Figure 7D:
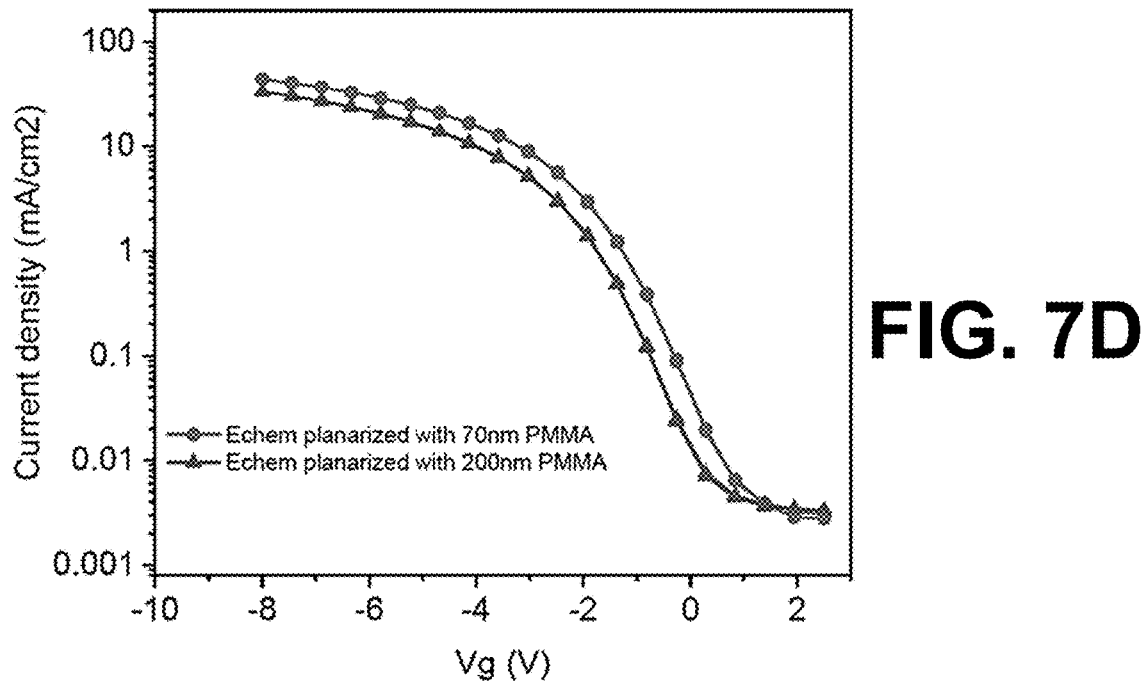
Figure 7E:
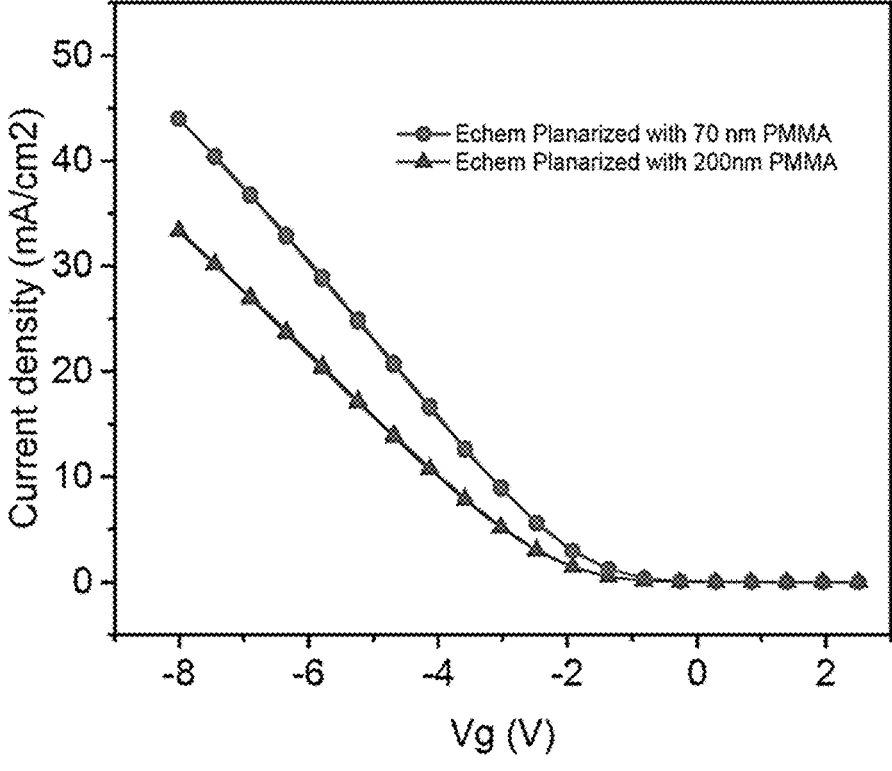

In the transfer curves, the maximum difference between the forward and reverse sweeps of the gate voltage at equal current density is the device hysteresis. Hysteresis, generally caused by charge traps at various interfaces, is undesirable because it means that different gate voltages are required for the same current density, depending on the history of that gate voltage. As shown in FIGS. 7D and 7E, the transfer curves of these EChem planarized devices exhibited negligible hysteresis of 30 mV and 35 mV for the 70 nm and 200 nm PMMA thickness planarized devices, respectively. These low hysteresis values demonstrate that the electrochemical planarization process did not introduce charge traps for the carriers at the SWCNT source electrode and gate dielectric interface. These results thus demonstrate that EChem planarization preserves the intrinsic device characteristics and is an effective method to eliminate electrical shorts in carbon nanotube films for electronic and display applications.

In the foregoing implementation 1 mM KOH was used as the electrolyte, however the electrolyte used could be basic (KOH, NaOH, etc.), neutral (e.g. 0.01M KCl, NaC etc.), or acidic (0.01M $H_2SO_4$, 0.01M $HNO_3$, etc.). It can be any electrolyte for which the electrochemically generated species disrupts the conductivity of the nanotubes.

Here the in-plane SWCNTs are coated with a thin protective layer that leaves the out of plane SWCNTs susceptible to attack that renders them non-conducting. To demonstrate the generality of the approach a distinct implementation is described as an example in which the out-of-plane SWCNTs are oxidized away in an oxygen plasma asher.

In this case a thin PMMA layer is again spin coated across the SWCNT film. Because PMMA is attacked by the oxygen radicals produced in the asher, a thin metal protective layer was additionally deposited by vacuum evaporation on top of the PMMA. This metal layer had a thickness that hermetically coated the PMMA across regions over the in-plane nanotubes, while being thin enough to possess defects in the immediate vicinity of protrusions. In that vicinity the oxygen radicals acquire access to the PMMA which reacts and is etched away as a gaseous product. The uncovered SWCNTs beneath this etched PMMA are also locally etched away.

Features of this process provide good control over the extent of the carbon nanotube film that is etched away as a function of the oxygen concentration, plasma power time and temperature. For a pinhole like defect in the metal film the reactive oxygen etchant and counterpropagating gaseous reaction products must pass through the pinhole. As the PMMA beneath the hole is etched away, a growing, disk-like void or region in the PMMA layer (and in the underlying nanotube film) develops. Because the PMMA layer is thin, the restricted volume created between the substrate and the metal film, as the PMMA is etched away acts to constrain the diffusion of reactive oxygen and reaction products within that confined volume. The etching progresses outwards from the central defect as a growing circular region of removed PMMA (and nanotubes), with the rate of removal slowing as the undercut progresses and the diameter of the circular region increases because of the effective 2-D confinement and restricted rate at which oxygen radicals can enter. This means that smaller, but still problematic protrusions, that create smaller defects in the metal layer, will permit the localized etching of the out of plane nanotubes before too much of the in-plane nanotube network has been etched away around larger defects. The self-limiting nature of the process increases the degree of control over elimination of the out-of-plane conductive nanotube pathways, with limited damage to the in-plane conductance.

Once the time in the asher, for a given $O_2$ concentration, power and temperature, has elapsed to ensure elimination of the out-of-plane nanotube conductive pathways, the metal covering the PMMA over the in-plane nanotube film is removed using a metal etchant and the PMMA is dissolved away using a solvent. The time can be experimentally determined for the given asher conditions and device structure.

As demonstration of this planarization method another device substrate was prepared as discussed in paragraph 0026 with a 70 nm layer of PMMA coating the SWCNT film followed by the deposition of 100 nm of Au by evaporation to serve as the protective metal. The substrate was ashed in a Tepla M4L Plasma Asher using 500 W of power and 300 sccm of $O_2$ at a pressure of 370 mTorr for 18 minutes. The metal layer was subsequently removed using Transene TFA etchant.

After this ashing based planarization, the PMMA layer was dissolved in organic solvents and 80 devices were built as described in paragraph 0027, followed by testing in a probe station (again using a flexible gold wire probe to contact the drain electrodes to avoid damage to the devices). Of these only one device was electrically shorted resulting in a yield for the process in this case of greater than 98%.

Figure 8:
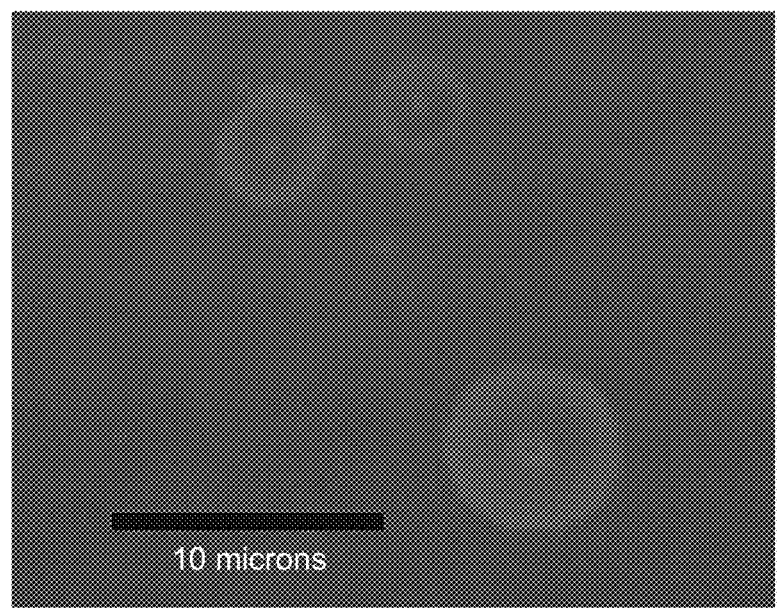
FIG. 8 is a high magnification optical image showing a region of a SWCNT film after use of an oxygen plasma asher to electrically planarize the SWCNT layer, in accordance with various embodiments of the present disclosure.

FIG. 8 shows a high magnification optical image of such an ash planarized SWCNT film after removal of the metal and PMMA layers. The black bar is 10 microns. The SWCNTs are too small to individually resolve, however, their conductance changes the reflectivity of the surface, distinguishing the region where their conductance has been modified by the ash. Of note is the circular nature of the features with a distinct reflectance at their center. With the SWCNTs that stabilize the particles at their locations etched away, the particles can wash off during the wet processing used to dissolve the metal and remove the PMMA, however, observe the remaining black particle at the center of the feature in the lower right corner. From the perspective of source-drain electrical shorts, removal of the particles is not necessary since they are decoupled from the in-plane film conductance.

Figure 9:
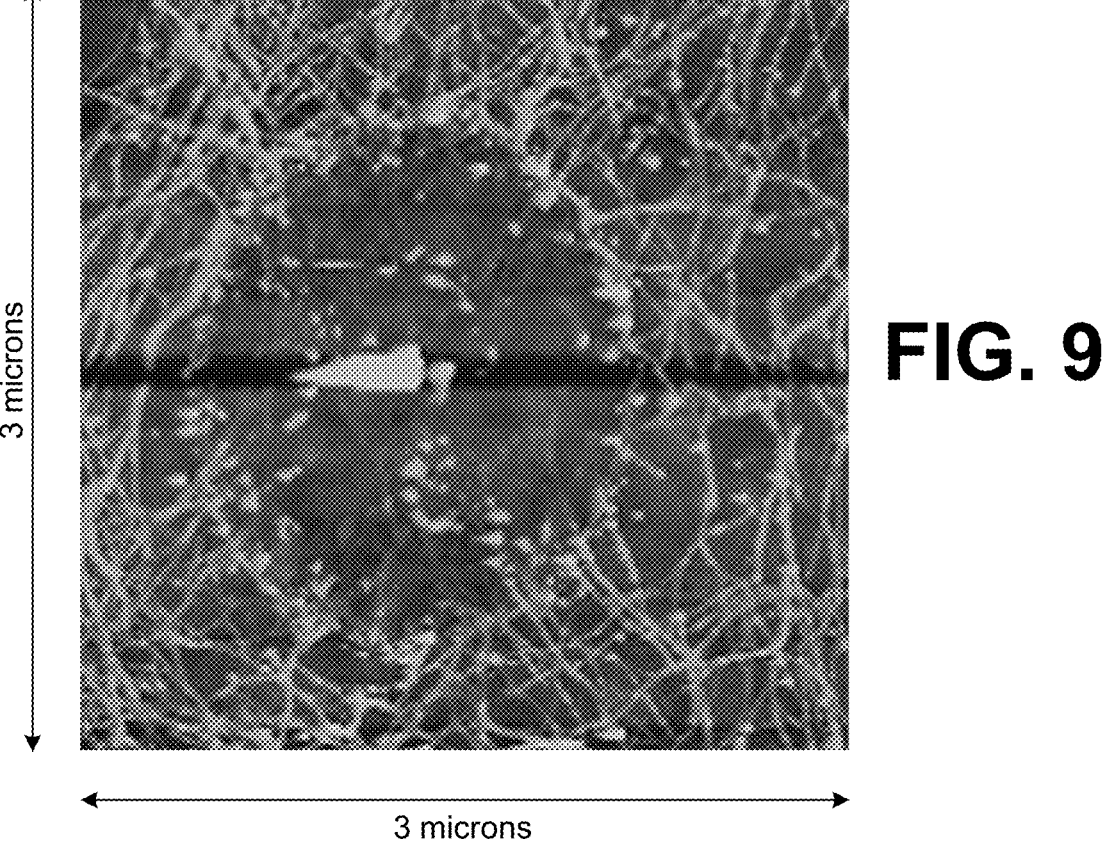
FIG. 9 is an atomic force microscopy image of a SWCNT film in a local region surrounding a particle after use of an oxygen plasma asher to electrically planarize the SWCNT layer, in accordance with various embodiments of the present disclosure.

FIG. 9 shows the atomic force microscopy (AFM) image of such an etched feature. The full image occupies 3 microns in each dimension. Brighter objects are higher. The in-plane SWCNT bundles surrounding the circular etched region are clearly visible. The AFM has trouble with the much taller central particle, the tip practically skips across it in the fast scan x-axis direction, resulting in its white smeared out appearance. The dark bands on either side of the particle are merely artifacts of the line-by-line plane fit dealing with the much higher particle.

The PMMA used in this process acts to protect the in-plane SWCNTs and the substrate beneath them from undergoing reactions with the metal or with the metal etchant used to remove the metal following the ashing step. In cases where such reactions are not deleterious to the ultimate device performance, the PMMA layer need not be used and the protecting metal can be deposited directly onto the SWCNT film, with other steps proceeding as described.

Generally, whatever the protective layer used may be, there are numerous alternative methods to disrupt the conductance of the less protected out-of plane SWCNTs that could be employed besides the electrochemical and ash methods demonstrated here. These include reactive ion etching, UV/ozone exposure, exposure to chemicals that react with SWCNT sidewalls by oxidation, esterification/amidation, halogenation, cycloaddition, radical, nucleophilic or electrophilic addition.

This general method for electrical planarization is entirely transferable to electronic devices that rely on the in-plane conductance of graphene where its out-of-plane conductance due to protrusions or particles are deleterious to the device performance.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

The invention claimed is:

1. A method for electrical planarization of nanotube films or networks, comprising:

depositing one or more thin protective organic and/or inorganic layer across a nanotube film;

disrupting electrical conductance of portions of the nanotube film by exposure of out-of-plane nanotubes to a planarization process that disrupts the electrical conductance through the one or more thin protective organic and/or inorganic layer; and removing the one or more thin protective organic and/or inorganic layer from the nanotube film.

2. The method of claim 1, wherein the nanotube film is disposed on a substrate surface, the nanotube film having an average nanotube film thickness, and the electrical conductance of out-of-plane nanotubes that protrude more than 10 times the average nanotube film thickness above the substrate surface is disrupted.

3. The method of claim 1, wherein the nanotube film comprises single wall carbon nanotubes.

4. The method of claim 1, wherein the nanotube film is disposed on a substrate in electrical contact with one or more contact pad or contact electrode.

5. The method of claim 4, wherein the substate is a glass substrate.

6. The method of claim 4, wherein at least one of the one or more contact pad or contact electrode is connected to a current supply line.

7. The method of claim 1, wherein at least a portion of the out-of-plane nanotubes is formed over a particle.

8. The method of claim 1, wherein the one or more thin protective organic and/or inorganic layer is deposited over the nanotube film.

9. The method of claim 8, wherein the one or more thin protective organic and/or inorganic layer comprises PMMA (polymethyl methacrylate).

10. The method of claim 8, wherein the one or more thin protective organic and/or inorganic layer has a thickness in a range from about 50 nm to about 300 nm.

11. The method of claim 10, wherein the one or more thin protective organic and/or inorganic layer has a thickness in a range from about 70 nm to about 200 nm.

12. The method of claim 1, wherein the planarization process comprises exposure of the out-of-plane nanotubes to oxidation through the one or more thin protective organic and/or inorganic layer.

13. The method of claim 12, where the out-of-plane nanotubes are exposed to an electrolyte for electrochemical oxidation.

14. The method of claim 13, wherein the electrolyte comprises a KOH electrolyte.

15. The method of claim 12, where the out-of-plane nanotubes are exposed to an oxygen plasma asher for oxidation.

16. The method of claim 12, where the out-of-plane nanotubes are exposed to ultraviolet (UV)/ozone for oxidation.

17. The method of claim 12 where the out-of-plane nanotubes are exposed to chemicals that disrupt the nanotube conductance by esterification/amidation, halogenation, cycloaddition, radical, nucleophilic or electrophilic addition.

18. The method of claim 1, further comprising:

forming a layer of semiconducting channel material on top of the nanotube film; and forming one or more electrodes on top of the layer of semiconducting channel material.

19. The method of claim 18, wherein the layer of semiconducting channel material comprises an organic semiconductor.

20. The method of claim 18, wherein the one or more electrodes comprises a drain electrode.

21. The method of claim 18, wherein OLED layers are deposited on top of the level of semiconducting channel material followed by deposition of an electron injecting drain electrode.

22. The method of claim 1, further comprising:

forming a layer of dielectric material on top of the nanotube film; and forming one or more electrodes on top of the layer of dielectric material to provide a top gate electrode.

23. The method of claim 1, further comprising:

forming a layer of dielectric material on top of the nanotube film to isolate the nanotube film from subsequently deposited layers.

* * * * *